United States Patent
Knebel et al.

(10) Patent No.: US 8,247,899 B2
(45) Date of Patent: Aug. 21, 2012

(54) POWER SEMICONDUCTOR MODULE COMPRISING A CONNECTION DEVICE WITH INTERNAL CONTACT SPRING CONNECTION ELEMENTS

(75) Inventors: Markus Knebel, Tuchenbach (DE); Peter Beckedahl, Oberasbach (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 192 days.

(21) Appl. No.: 12/758,237

(22) Filed: Apr. 12, 2010

(65) Prior Publication Data
US 2010/0258935 A1  Oct. 14, 2010

(30) Foreign Application Priority Data
Apr. 11, 2009  (DE) .................. 10 2009 017 733

(51) Int. Cl.
*H01L 23/498* (2006.01)
*H01L 23/48* (2006.01)

(52) U.S. Cl. .......... 257/691; 257/E23.062; 257/E23.06; 257/E23.01; 257/696; 257/686; 257/692; 257/700; 257/690

(58) Field of Classification Search .................. 257/691, 257/692, 700, 690, E23.06, E23.062, E23.01, 257/698, 696
See application file for complete search history.

(56) References Cited

U.S. PATENT DOCUMENTS

| | | | |
|---|---|---|---|
| 7,042,074 B2 | 5/2006 | Göbl et al. | |
| 7,230,341 B2 * | 6/2007 | Hashimoto | 257/787 |
| 7,626,256 B2 | 12/2009 | Göbl et al. | |
| 2004/0227235 A1 * | 11/2004 | Hashimoto | 257/734 |
| 2006/0103000 A1 * | 5/2006 | Kurosawa | 257/690 |

FOREIGN PATENT DOCUMENTS

| | | |
|---|---|---|
| DE | 103 55 925 | 6/2005 |
| DE | 2006 013 078 | 4/2007 |
| DE | 10 2006 027 482 | 8/2007 |
| DE | 102006027482 B3 * | 8/2007 |
| EP | 1 933 379 | 6/2008 |
| EP | 1 956 647 | 8/2008 |

* cited by examiner

*Primary Examiner* — A O Williams
(74) *Attorney, Agent, or Firm* — The Law Offices of Roger S. Thompson

(57) ABSTRACT

A power semiconductor module comprises at least one power semiconductor component and a connection device which makes contact with the power semiconductor component. The connection device is composed of a layer assembly having at least one first electrically conductive layer facing the power semiconductor component and forming at least one first conductor track, and an insulating layer following in the layer assembly, and a second layer following further in the layer assembly and forming at least one second conductor track, the second layer being remote from the power semiconductor component. The power semiconductor module has at least one internal connection element, wherein the internal connection element is embodied as a contact spring having a first and a second contact section and a resilient section. The first contact section has a common contact area with a first or a second conductor track of the connection device.

9 Claims, 2 Drawing Sheets

POWER SEMICONDUCTOR MODULE COMPRISING A CONNECTION DEVICE WITH INTERNAL CONTACT SPRING CONNECTION ELEMENTS

BACKGROUND OF THE INVENTION

1. Field of the Invention

The invention is directed to a power semiconductor module having an internal connection device embodied as a layer assembly composed of a plurality of electrically conductive layers, which form a plurality of conductor tracks, and insulating layers arranged between the conductive layers. The connection device serves to electrically connect power semiconductor components to one another or to further conductor tracks of a substrate.

2. Description of the Related Art

Known semiconductor modules are described by way of example in German Published Patent Application No. DE 103 55 925 A1, which discloses, in principle, a connection device of the type mentioned above. In this patent, the power semiconductor components are permanently electrically connected to a first conductive layer by ultrasonic welding. The module-internal circuit-conforming connection of the power semiconductor components, which includes both internal load and control connections, is disclosed in that patent. For this purpose, the connection device has through contacts between electrically conductive layers and insulating layers. In this way, conductor tracks of one layer are electrically connected to conductor tracks of another layer.

An external connection device of a power semiconductor module of the abovementioned type is disclosed in German Patent No. DE 10 2006 027 482 B3. That patent discloses the use of screw and spring-loaded plug contact connections.

By contrast, German Published Patent Application No. DE 10 2006 013 078 A1 discloses a power semiconductor module comprising an abovementioned connection device in which the through contacts between two electrically conductive layers are formed by thin wire bonding. Since a connection device of this type is also intended to serve to replace bonding connections within a power semiconductor module and, as a result of its use, to improve the durability of the internal connections, the use of the thin wire bonding connection to form a through contact is completely satisfactory.

Therefore, it is an object of the invention to provide a power semiconductor module having a connection device with a reduced number of wire bonding connections.

SUMMARY OF THE INVENTION

The inventive concept is directed to a power semiconductor module of the type mentioned in the introduction comprising at least one power semiconductor component and a connection device for the circuit-conforming module-internal connection of the at least one power semiconductor component to a further power semiconductor component or to a conductor track of a substrate. Power semiconductor modules of this type can preferably be arranged on a cooling device by means of a substrate. Furthermore, a power semiconductor module of this type preferably has an insulating housing enclosing the substrate with the at least one power semiconductor component and the connection device.

The connection device consists of a layer assembly composed of at least two electrically conductive layers and an insulating layer arranged therebetween. In a preferred embodiment of the invention, further layer sequences composed of insulating and conductive layers of the connection device are provided. For purposes of illustration, and not limitation, reference hereinafter is made only to the simplest configuration of the connection device comprising two electrically conductive layers and one insulating layer, for clarity.

The conductive layers can be inherently structured and thereby form a plurality of first conductor tracks insulated from one another. At least one first conductor track of the first conductive layer is electrically conductively connected to a contact area of a power semiconductor component. A cohesive connection, or a pressure contact connection according to the prior art, has proved to be particularly advantageous in this case. In the layer sequence, this first conductive layer facing the power semiconductor component is followed by an insulating layer and then a further conductive layer—which is remote from the power semiconductor component—of the connection device.

According to the invention, the power semiconductor component has at least one internal connection element, embodied as a contact spring comprising first and second contact section and a resilient section. The first contact section of the contact spring has a common contact area with a first or second conductor track of the connection device.

In this case, it is preferred if the contact area with a first or second conductor track is arranged in a recess of the connection device. This increases the contact reliability between the conductor track and the contact spring, even under mechanical or thermal influences that could bring about a lateral movement of the entire contact spring or of a first contact device of the contact spring. This also simplifies a possible mounting and guidance of the contact spring in the housing, since this has to satisfy minor requirements made of the positioning of the contact spring or the first contact section thereof.

In a first preferred configuration, the recess is formed by a cutout of the second conductor track and the insulating layer. An opening in the connection device which reaches through as far as the first conductor track is thus formed, whereby the contact area is arranged on the first conductor track and the contact spring produces an electrically conductive connection to the first conductor track.

In a second preferred configuration, the recess is formed by a depression of the second conductor track, which does not cut completely through the conductor track, whereby the contact area is arranged on the second conductor track and the contact spring thus produces an electrically conductive connection to the second conductor track.

It is furthermore particularly advantageous if the second contact device of the contact spring projects from the housing of the power semiconductor module. The power semiconductor module, and thus the connection device, can thereby be connected directly to external connection elements.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
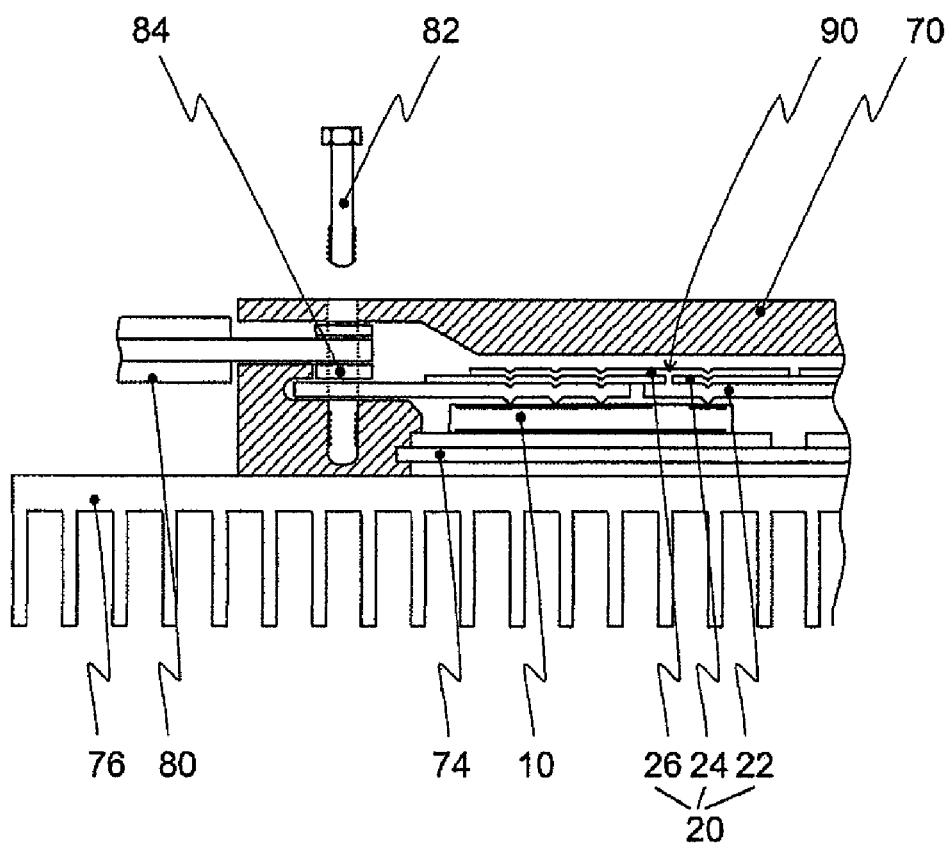
FIG. 1 is a section of a power semiconductor module according to the prior art.

FIG. 1 shows a power semiconductor module according to the prior art in section, shown generally at 2. The prior art power semiconductor module 2 is arranged on a cooling device 76, wherein power semiconductor module 2 includes a substrate 74 with a power semiconductor component 10 and a connection device 20. These parts 10, 20, 74 of power semiconductor module 2 are enclosed and covered by a housing 70. Here substrate 74 forms the lower termination of power semiconductor module 2.

Connection device 20 is formed by a layer sequence composed of a first electrically conductive layer 22 facing power semiconductor component 10, an insulating layer 24 following electrically conductive layer 22 in the layer sequence, and a second conductive layer 26. It is preferred if the layer thicknesses of electrically conductive layers 22, 26 are between about 10 μm and about 500 μm and if the layer thickness of insulating layer 24 is between about 2 μm and about 100 μm.

The electrically conductive layers 22, 26 form, in accordance with the prior art, the module-internal circuit-conforming connection of power semiconductor components 10 and substrate 74 and thereby replace the widely known wire bonding connections. In this case, however, it is also necessary to provide through-plating 90 for connecting first conductor tracks 22 of the first electrically conductive layer to second conductor tracks 26 of second electrically conductive layer 26. These are embodied as electrically conductively filled recesses of insulating layer 24.

Furthermore, connection device 20 here serves for external contact-connection in the form of a screw connection 82, 84 to external connection elements 80. This type of external contact-connection is particularly suitable for load connections. External contact-connections 82, 84 of auxiliary connections such as control connections, auxiliary emitter connections or sensor connections are also known as plug or soldering connections.

Figure 2:
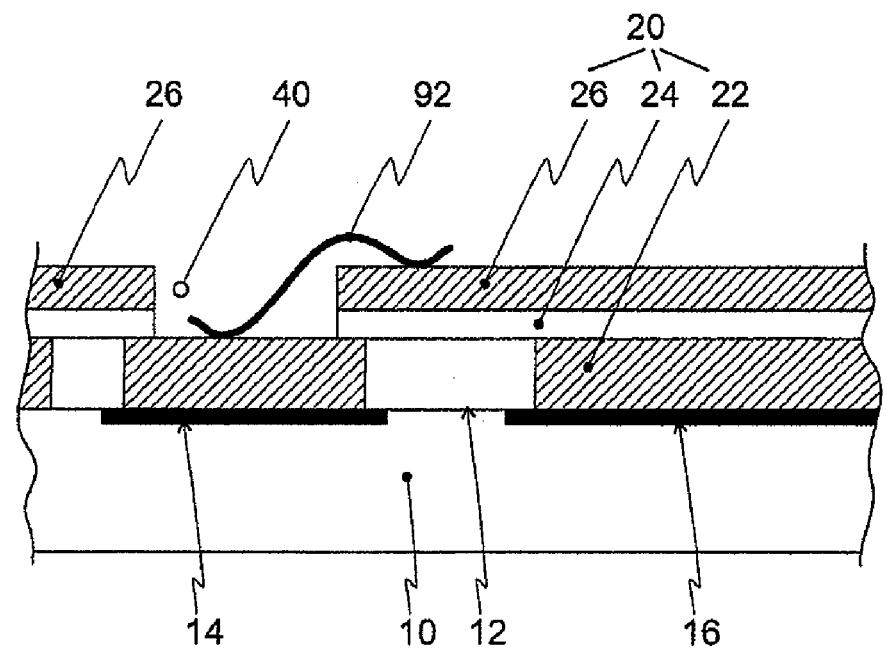
FIG. 2 is a detail of the connection device of a power semiconductor module according to the prior art.

FIG. 2 shows details of the connection device of power semiconductor module 2 comprising a control 14 and an emitter connection region 16 according to the prior art. The illustration here shows an alternative to through-plating 90 mentioned above, cf. FIG. 1. In this known configuration, a thin wire bonding connection 92 arranged partly in a recess 40 of connection device 20 forms the electrically conductive connection between a first conductor track of first electrically conductive layer 22 of the connection device and a second conductor track of second electrically conductive layer 26.

Figure 3:
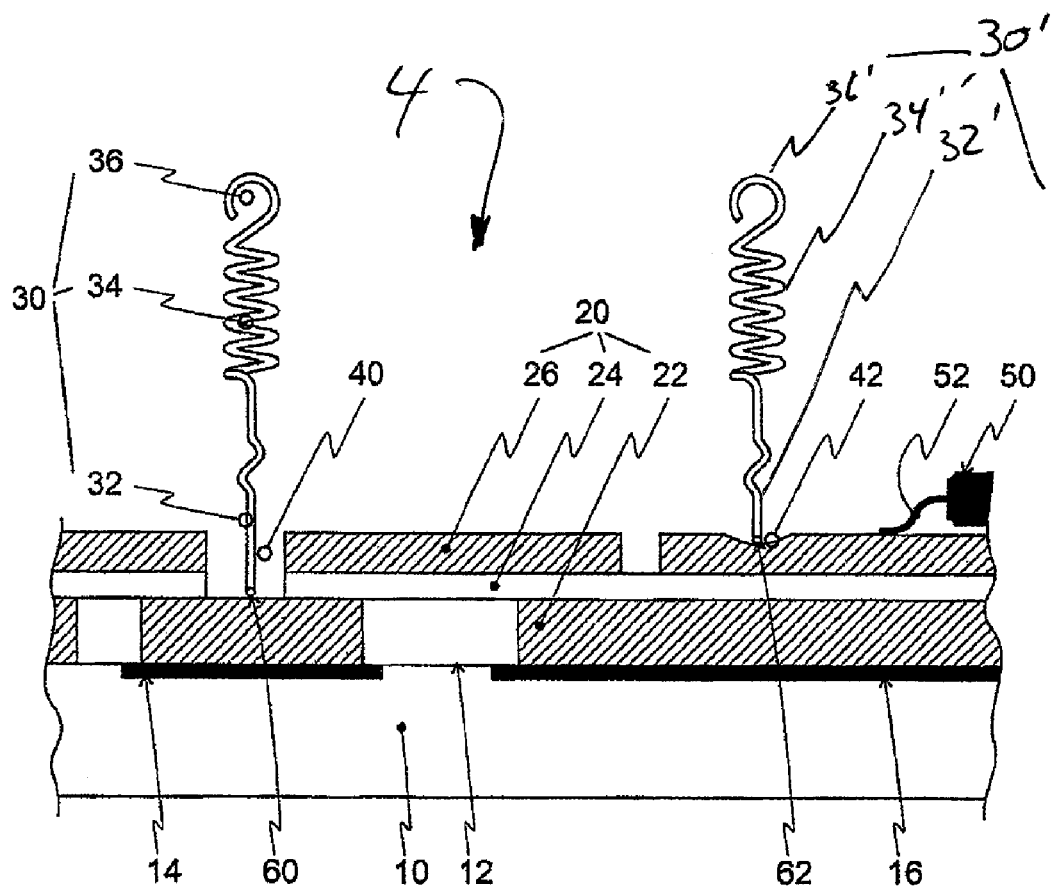
FIG. 3 is detail of the connection device of a power semiconductor module according to the invention.

FIG. 3 shows details of connection device 20, power semiconductor component 10 and a sensor 50 of a power semiconductor module 4 according to the invention. Power semiconductor component 10, here a power transistor, has two contact regions, a control contact region 14 and an emitter contact region 16, at its first main area 12. These two contact regions 14, 16 are connected to respective first conductor tracks 22 of the first layer of connection device 20, which first conductor tracks are, of course, electrically insulated from one another. It is particularly preferred if these two connections are embodied as cohesive connections, preferably produced by sintering.

Connection device 20 here has three first conductor tracks 22 electrically insulated from one another, formed by the structuring of first electrically conductive layer 22. First conductive layer 22 forms that area of connection device 20 which faces power semiconductor component 10. Furthermore, connection device 20 has two sections of insulating layer 24. In the layer construction of the connection device 20, there then follows, on that side of the connection device 20 which is remote from power semiconductor component 10, second electrically conductive layer 26 of connection device 20, which second electrically conductive layer 26 is likewise structured and thus has three second conductor tracks 26 electrically insulated from one another.

A housed or else unhoused sensor 50 is electrically conductively connected to one of second conductor tracks 26 by means of connection elements 52. Sensor 50 serves for measuring, for example, the current or temperature in power semiconductor module 4. For its external connection, power semiconductor module 4 has a first internal connection elements 30, 30'. Elements 30, 30' are each respectively embodied as a contact spring 30, 30' comprising first 32, 32' and second contact sections 36, 36' and a resilient section 34, 34' therebetween. First contact section 32' is in electrically conductive contact with a respective second conductor track 26 and for this purpose has a common contact area 62 therewith.

Contact area 62 is arranged in a recess 42 of second conductor track 26, which is formed by a depression of second conductor track 26. First contact section 32' of contact spring 30' can be formed in different ways; what is essential here, further, is the formation of recess 42 of second conductor track 26. A lateral movement of first contact section 32' of contact spring 30' caused by mechanical or thermal action is substantially prevented by recess 42.

The same effect is also achieved by means of a recess 40 formed by a cutout of regions of insulating layer 24 and also of second electrically conductive layer 26 which lie one above another. These cutouts are formed in such a way that recess 40 reaches through connection device 20 as far as first electrically conductive layer 22.

Contact spring 30 arranged in recess 40 thus makes contact, at the contact area 60, with that individual first conductor track 22 which is connected to control connection 14 of power semiconductor component 10. Direct driving of the power semiconductor component 10 by means of an internal connection element, i.e., contact spring 30, is thus possible. In this case, it is particularly advantageous if second contact section 36 can be directly connected to external leads (not shown).

Figure 4:
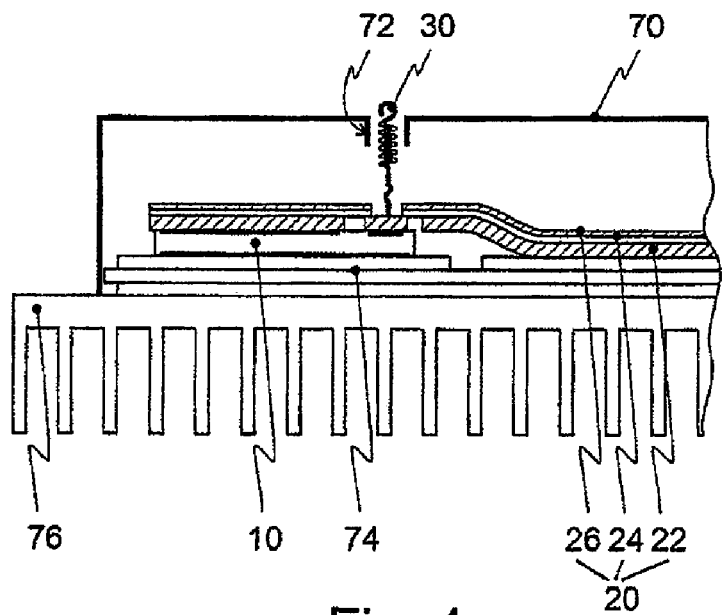
FIG. 4 is a section of a power semiconductor module according to the invention.

FIG. 4 shows a sectional view of power semiconductor module 4. Power semiconductor module 4 comprises a substrate 74 arranged on a cooling device 76, and includes an enclosing housing 70. The module-internal circuit-conforming connection is formed by connection device 20 as described. The internal contact devices, contact springs 30, only one of which is illustrated, are arranged in guides 72 of cup-shaped housing 70, wherein their second contact sections 36 project from housing 70 and can be connected directly to external connection elements, such as a control circuit board, for example.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same result(s) are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   at least one power semiconductor component;
   a connection device which makes contact with said power semiconductor component, said connection device including a recess and a layer assembly, said layer assembly having:
      at least one first electrically conductive layer facing the power semiconductor component and forming at least one first conductor track;
      an insulating layer following in the layer assembly; and
      a second electrically conductive layer following further in the layer assembly and forming at least one second conductor track;
   wherein said second layer is remote from said power semiconductor component, and has at least one internal connection element, said internal connection element being embodied as a contact spring having a first and a second contact section and a resilient section therebetween, said first contact section having a common contact area with a conductor track of said connection device, said common contact area being located in said recess; and
   wherein said contact spring exerts pressure on said recess in a direction towards the power semiconductor component.

2. The power semiconductor module of claim 1, wherein said recess is formed by a cutout of said second conductor track and of said insulating layer and said contact area is thus arranged on said first conductor track.

3. The power semiconductor module of claim 1, wherein said recess is formed by a depression of said second conductor track and said contact area is arranged on said second conductor track.

4. The power semiconductor module of claim 1, wherein the layer thicknesses of said first and second electrically conductive layers are each between from about 10 µm and about 500 µm and the layer thickness of said insulating layer is between about 2 µm and about 100 µm.

5. The power semiconductor module of claim 1, wherein said at least one power semiconductor component is arranged on a substrate and the power semiconductor module has a housing, which encloses and covers the substrate with said at least one power semiconductor component and said connection device in said housing.

6. The power semiconductor module of claim 5, wherein said internal connection elements are arranged partly in guides of said housing and said second contact sections of said internal connection elements project from said housing and can be connected there to external connection elements.

7. The power semiconductor module of claim 1,
   wherein said power semiconductor component includes at least one connection region; and
   wherein at least one first conductor track of said connection device is connected to said at least one connection region.

8. The power semiconductor module of claim 7, wherein said at least one connection region is a cohesive connection.

9. The power semiconductor module of claim 7, wherein said at least one connection region is a pressure contact connection.

* * * * *